United States Patent [19]
Kano et al.

[11] Patent Number: 5,936,159
[45] Date of Patent: Aug. 10, 1999

[54] SEMICONDUCTOR SENSOR HAVING MULTI-LAYER MOVABLE BEAM STRUCTURE FILM

[75] Inventors: Kazuhiko Kano, Obu; Yukihiro Takeuchi, Seto; Takamoto Watanabe, Nagoya; Kenichi Ao, Tokai; Masakazu Kanosue, Nagoya; Hirofumi Uenoyama, Anjo, all of Japan

[73] Assignee: Nippondenso Co., Ltd., Kariya, Japan

[21] Appl. No.: 08/755,097

[22] Filed: Nov. 25, 1996

Related U.S. Application Data

[62] Division of application No. 08/401,144, Mar. 8, 1995, Pat. No. 5,587,343.

[30] Foreign Application Priority Data

| Mar. 9, 1994 | [JP] | Japan | 6-38836 |
| Feb. 20, 1995 | [JP] | Japan | 7-31163 |

[51] Int. Cl.$^6$ ........................................ G01P 15/08
[52] U.S. Cl. ........................ 73/514.36; 73/514.16
[58] Field of Search .................... 73/514.16, 514.21, 73/514.22, 514.23, 514.36, 514.37, 514.38, 514.32, DIG. 1

[56] References Cited

U.S. PATENT DOCUMENTS

| 4,849,071 | 7/1989 | Evans et al. . | |
| 4,893,509 | 1/1990 | Maciver et al. . | |
| 5,059,556 | 10/1991 | Wilcoxen . | |
| 5,095,401 | 3/1992 | Zavracky | 73/514.32 |
| 5,129,983 | 7/1992 | Greiff . | |
| 5,242,863 | 9/1993 | Ziang-Zheng et al. . | |
| 5,262,000 | 11/1993 | Welbourn et al. . | |
| 5,500,549 | 3/1996 | Takeuchi et al. . | |
| 5,504,356 | 4/1996 | Takeuchi et al. . | |
| 5,572,057 | 11/1996 | Yamamoto . | |

FOREIGN PATENT DOCUMENTS

| 0 194 953 | 4/1990 | European Pat. Off. . |
| 2-134570 | 5/1990 | Japan . |
| 4-25764 | 1/1992 | Japan . |
| 92/03740 | 3/1992 | WIPO . |

OTHER PUBLICATIONS

Payne, et al., "Surface Micromachined Accelerometer. A Technology Update," SAE Feb. 1991, pp. 127–135.
Nathanson, et al., "The Resonant Gate Transistor," IEEE Transactions On Electron Devices, Mar. 1967, pp. 117–133.
Nathanson, et al., "A Resonant–Gate Silicon Surface Transistor With High–Q Band–Pass Properties," Applied Physics Letters, Aug. 1965, pp. 84–86.
Guckel, et al., "Fabication Of Micromechanical Devices From Polysilicon Films With Smooth Surfaces," Sensors And Actuators, 1989, pp. 117–122 (no month).
Guckel, et al., "The Application Of Fine–grained, Tensile Polysilicon To Mechanically Resonant Transducers," Sensors And Actuators, 1990, pp. 346–351 (no month).
Guckel, "Surface Micromachine Pressure Transducers," Sensors And Actuators, 1991, pp. 133–146 (no month).
Orpana, et al., "Control Of Residual Stress Of Polysilicon Thin Films By Heavy Doping In Surface Micromachining," IEEE, 1991, pp. 957–960 (no month).
Burns, et al., "Thin Films For Micromechanical Sensors," J. Vac. Sci. Technol., Jul./Aug. 1990, pp. 3606–3613.
Johnson, et al., "Effects Of Processing On The Behavior Of Thin Film Materials For Micromechanical Systems", IARP Worshop, pp. 92–101 (no date).

(List continued on next page.)

*Primary Examiner*—Christine K. Oda
*Attorney, Agent, or Firm*—Pillsbury Madison & Sutro LLP

[57] ABSTRACT

A semiconductor sensor including a movable member beam structure having a reduced deflection characteristic. The sensor includes a movable beam structure film suspended from a semiconductor substrate, with a gap interposed between the beam structure film and the substrate. The beam structure film is composed of a plurality of film layers that are laminated in a direction of film thickness. Further, a stress relieving layer is interposed between respective films to reduce overall internal stress on the structure.

10 Claims, 16 Drawing Sheets

OTHER PUBLICATIONS

Koskinent, et al., Microtensile Testing Of Free–standing Polysilicon Fibers Of Various Grain Sizes, J. Micromech Microeng., 1993, pp. 13–17 (no month).

Burns, "LPCVD Polysilicon," PhD Thesis, Madison, May 1988, pp. 112–123.

Guckel, et al., Fine Grained Polysilicon And Its Application To Planar Pressure Transducers, pp. 277–282. 1987. (no month).

Core, et al: "Fabrication Technology for an Integrated Surface–Micromachined Sensor", Solid State Technology, Oct. 1993, pp. 39–40.

SEMICONDUCTOR SENSOR HAVING MULTI-LAYER MOVABLE BEAM STRUCTURE FILM

CROSS REFERENCE TO RELATED APPLICATION

This application is based upon and claims the benefit of priority of the prior Japanese Patent applications No. 6-38836 filed on Mar. 9, 1994 and No. 7-31167 filed on Feb. 20, 1995, the contents of which are incorporated herein by reference.

This application is a division of Ser. No. 08/401,044 Mar. 8, 1995 U.S. Pat. No. 5,587,343.

BACKGROUND OF THE INVENTION

1. Field of the Invention

The present invention relates to a semiconductor sensor. More particularly, the present invention relates to a semiconductor sensor to detect a physical quantity, such as acceleration, yaw rate, vibration, or the like.

2. Related Arts

Recently, demand has grown for a semiconductor acceleration sensor of greater compactness and lower cost. To this end, a differential-capacitaiice type semiconductor acceleration sensor employing polycrystalline silicon as an electrode was disclosed in PCT WO 92/03740. A sensor of this type is described utilizing FIGS. 29 and 30. FIG. 29 indicates a plan view of the sensor, and FIG. 30 is an I—I sectional view of FIG. 29.

A movable member 116 having a beam structure is disposed above a silicon substrate 115 with a predetermined gap interposed therebetween. The movable member 116 composed of polycrystalline silicon thin film includes anchor sections 117, 118, 119, and 120, beam sections 121 and 122, a weight section 123, and movable electrode sections 124. The beam sections 121 and 122 extend from the anchor sections 117, 118, 119, and 120 of the movable member 116, and the weight section 123 is supported by these beam sections 121 and 122. The movable electrode sections 124 are formed on weight section 123. Two fixed electrodes 125 are disposed on the silicon substrate 115 to oppose one movable electrode section 124. Accordingly, the structure is such that in a case of acceleration applied in a direction parallel to the surface of the silicon substrate 115 (indicated by Y in FIG. 29), electrostatic capacitance between the movable electrode portion 124 and the fixed electrodes 125 increases on one side and decreases on the other.

In fabricating this sensor, as shown in FIG. 31, a sacrificial layer 126 of silicon oxide film or the like is formed on the silicon substrate 115, and holes 127 are formed in the sacrificial layer 126 at places which become anchor sections. Thereafter, as shown in FIG. 32, a polycrystalline silicon film, which becomes the movable member 116, is deposited on the sacrificial layer 126 and configured in the specified pattern. In continuation, as shown in FIG. 33, the sacrificial layer 126 below the movable member 116 is etched away with an etchant, and the movable member 116 is disposed above the silicon substrate 115 with a predetermined gap interposed therebetween.

However, as is shown in FIG. 34, during film formation, internal stress a is exerted from the interface of the sacrificial layer 126 to the movable member 116 composed of polycrystalline silicon thin film, and internal stress a gradually changes and increases in the direction of film thickness. As a result of this, an internal stress distribution exists in the direction of film thickness in the movable member 116, causing the movable member to warp. That is to say, as shown in FIG. 29 the movable electrode section 124 assumes a cantilever structure taking the weight section 123 as a fixed end, and the movable electrode section 124 is warped due to the internal stress distribution existing in the direction of film thickness. As a result of this, the movable electrode section 124 and the fixed electrode 125 are not accurately disposed in an opposing relation with good precision. Additionally, deflection due to the internal stress distribution is generated in the weight section 123 as well. As a result of this, the movable electrode section 124 protruding from this weight section 123 are also displaced. As a result the movable electrode section 124 and the fixed electrode 125 are not accurately disposed in an opposing relation with good precision.

As a general means to reduce the internal stress of a film structure body such as this, long-term, high-temperature heat treatment on the film structure body (for example 24 hours at 1,150° C.) is performed. However, this method could not be compounded with an IC process because it would inflict damage on transistors and circuitry provided in the periphery of the movable member 116 on the silicon substrate 115, and as a result, applying peripheral circuitry in this type of semiconductor substrate acceleration sensor was not practical.

SUMMARY OF THE INVENTION

Accordingly, it is an object of the present invention to provide a semiconductor sensor which can reduce deflection of a movable member of a beam structure.

The present invention relates to a semiconductor sensor comprising a semiconductor substrate and a movable member having beam structure composed of a thin film and disposed above the semiconductor substrate with a predetermined gap interposed therebetween so as to detect a physical quantity from changes in the movable member accompanying exertion of a physical quantity, wherein a sacrificial layer is formed on the semiconductor substrate and when a movable member film is formed on the sacrificial layer, the film formation thereof is executed over a plurality of steps. Additionally, the sacrificial layer is etched away after formation of the movable member.

Moreover, when the movable member film formation is separated into a plurality of steps, it is acceptable to interpose an internal stress relieving layer between the films formed during each step. The stress relieving layer initializes and relieves the internal stress effectively.

More specifically, it is acceptable to form the movable member as a polycrystalline silicon thin film by means of a low-pressured chemical vapor deposition method, That is to say, after polycrystalline silicon is formed to a predetermined thickness by means of supplying silane to an oven, it is acceptable to stop the supply of silane and form a silicon oxide film as an internal stress relieving layer by means of atmosphere $O_2$, and again form polycrystalline silicon to a predetermined thickness by means of supplying silane to the oven.

Additionally, it is acceptable to remove the internal stress relieving layer by means of annealing after film formation.

According to experimental findings of the inventors, i⁺ was determined that if the film, which becomes the movable member, is formed over a plurality of steps, stress distribution from the sacrificial layer is initialized in the respective layers and is reduced. Further, when an internal stress relieving layer, such as oxide thin film and so on, is formed during film formation of the movable member, internal stress generated from the interface with the sacrificial layer is effectively relaxed in the internal stress relieving layer. As a result of this, internal stress in the direction of film thickness of the movable member is reduced, and deflection is suppressed.

Herein, internal stress in the overall direction of film thickness as a movable member is reduced further in correspondence with the larger the number of steps in the film formation process.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A specific first embodiment according to the present invention will be described hereinafter with reference to the drawings.

Figure 1:
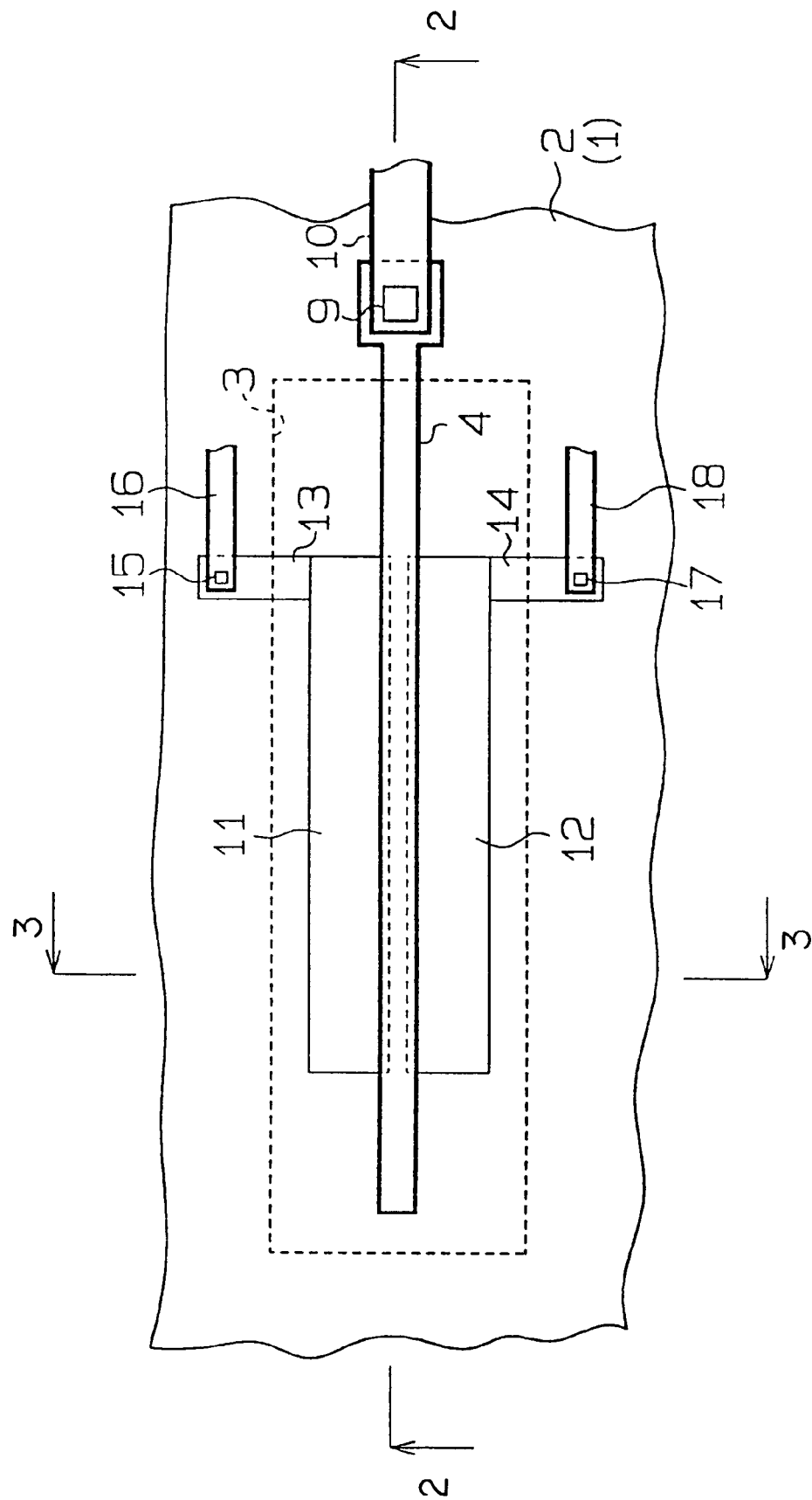
FIG. 1 is a plan view of a semiconductor acceleration sensor according to a first embodiment.

FIG. 1 indicates a plan view of a semiconductor acceleration sensor according to this embodiment. In addition, FIG. 2 indicates a sectional view taken along line 2—2 of FIG. 1, and FIG. 3 indicates a sectional view taken along line 3—3 of FIG. 1.

According to this embodiment, a silicon oxide film 2 is formed on a p-type silicon substrate 1. Additionally, a region of oblong configuration having no silicon oxide film 2, i.e., a gap 3, is formed on the p-type silicon substrate 1 (see FIG. 1). One end of a movable member 4, as a gate electrode is supported on the silicon oxide film 2. This movable member 4 assumes a cantilever structure extending into the gap 3, and is provided above the silicon substrate 1 with a predetermined gap interposed therebetween. Furthermore, the movable member 4 is composed of a polycrystalline silicon thin film extending linearly in a belt configuration. In greater detail, the movable member 4 is composed of a first polycrystalline silicon layer 5 of 1 $\mu$m thickness, a silicon oxide film layer 6 as an internal stress relieving layer of several angstroms to several tens of angstroms thickness, and a second polycrystalline silicon layer 7 of 1 $\mu$m thickness. In addition, the p-type silicon substrate 1 and the movable member 4 are isolated by means of the silicon oxide film 2.

Herein, the gap 3 in a lower portion of the movable member 4 is formed by means of etching a portion of the silicon oxide film 2 as a sacrificial layer. At the time of this sacrificial layer etching, an etchant, which etches the silicon oxide film 2, which is a sacrificial layer, without etching the movable member 4, is utilized.

Additionally, an interlayer insulation film 8 is disposed on the silicon oxide film 2, and a contact hole 9 is defined therein. An aluminum lead 10 electrically connects to the movable member 4 via hole 9.

Figure 3:
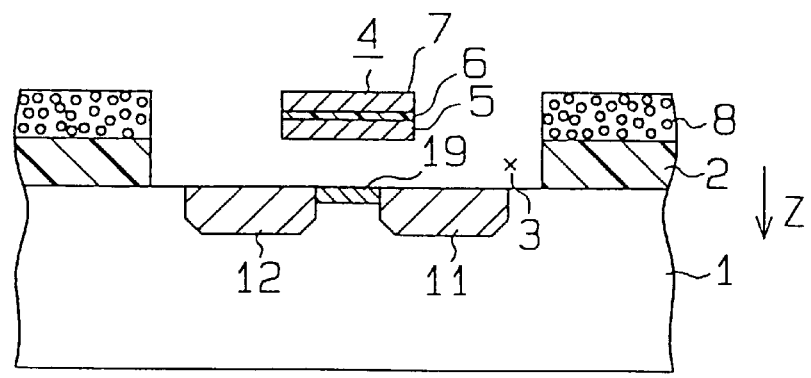
FIG. 3 is a sectional view take along line 3—3 of FIG. 1.

In FIG. 3, fixed electrodes 11 and 12 composed of an impurity diffusion region are formed on the surface of the p-type silicon substrate 1 corresponding to both sides of the movable member 4. These fixed electrodes 11 and 12 are formed by means of introducing n-type impurities into the p-type silicon substrate 1 by means of an ion-impiantation process or the like.

Additionally, as is shown in FIG. 1, leads 13 and 14 composed of an impurity diffusion region are formed on the p-type silicon substrate 1. The leads 13 and 14 are formed by means of introducing n-type impurities into the p-type silicon substrate 1 by means of an ion-implantation process or the like. Accordingly, the fixed electrode 11 and the lead 13, and the fixed electrode 12 and lead 14, are respectively electrically connected.

Furthermore, the lead 13 is electrically connected to an aluminum lead 16 via a contact hole 15. Additionally, the lead 14 is electrically connected to an aluminum lead 18 via a contact hole 17. Accordingly, the aluminum leads 16, 18, and 10 are connected to peripheral circuitry formed within the same substrate.

In addition, an inversion layer 19 is formed between the fixed electrodes 11 and 12 on the p-type silicon substrate 1. This inversion layer 19 is generated by means of applying voltage to the movable member (cantilever) 4.

Operation of the semiconductor acceleration sensor will be described next utilizing FIG. 3.

When voltage is applied between the movable member 4, as a gate electrode, and the silicon substrate 1, and between the fixed electrodes 11 and 12, the inversion layer 19 is formed and current flows becween the fixed electrodes 11 and 12. In a case wherein this acceleration sensor is subjected to acceleration and the movable member 4 is displaced in the Z direction indicated in the drawing, the carrier concentration of the inversion layer 19 increases due to a change in the field strength, and current increases. In this manner, the acceleration sensor detects an acceleration by an increase or decrease in the amount of current.

Next, a method of fabricating a semiconductor acceleration sensor structured in this manner will be described utilizing FIGS. 4 to 17. Herein, the movable member forming region (sensing region) is indicated on the left-hand side of the respective drawings, and a transistor composing a portion of peripheral circuitry is indicated on the right-hand side.

Figure 4:
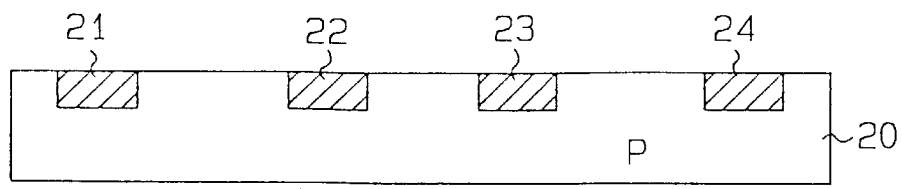
FIGS. 4 to 17 are sectional views for the purpose of describing a method for fabricating a semiconductor acceleration sensor according to the first embodiment.

As is shown in FIG. 4, a p-type silicon substrate 20 is prepared and undergoes a photo-lithographic process, and n-type diffusion regions 21, 22, 23, and 24, which become source/drain lead portions of a movable member forming region (sensing region) and of peripheral circuitry, are formed by means of an ion-implantation process or the like.

Figure 5:
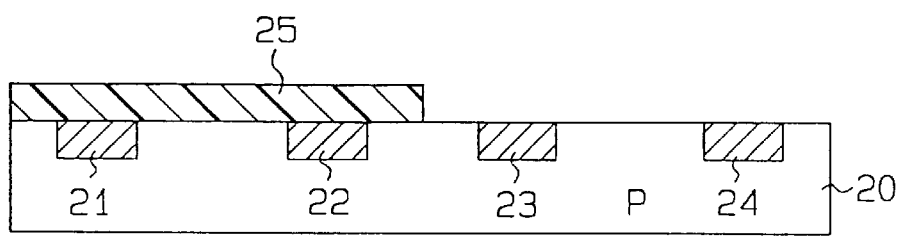

Accordingly, as is shown in FIG. 5, a silicon oxide film 25, of which a portion thereof becomes a sacrificial layer, is formed in the movable member forming region (sensing region). Additionally, it is also acceptable to form the silicon oxide film 25 on the entirety of the substrate and thereafter etch away the silicon oxide film of a region where the transistor forming region of the peripheral circuitry is located.

Figure 6:
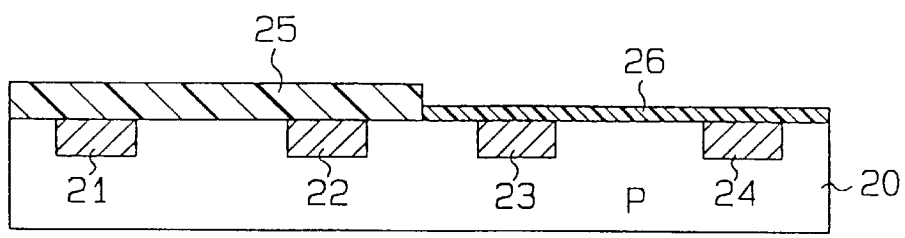

Furthermore, as is shown in FIG. 6, a gate oxide film 26 is formed by means of gate oxidation in the transistor forming region of the periphery circuitry. Accordingly, a movable member (polycrystalline silicon film) is formed by means of a low-pressured chemical vapor deposition method.

Figure 7:
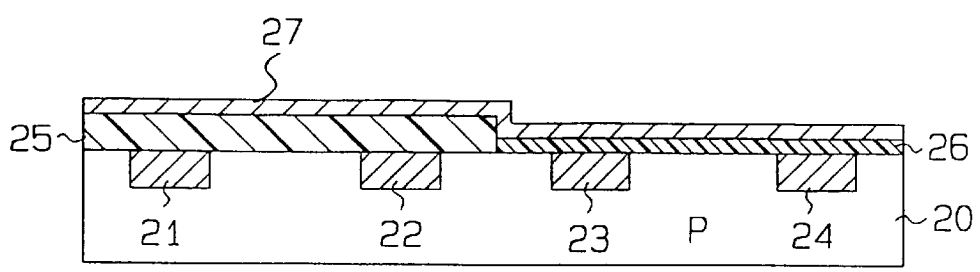
Figure 8:
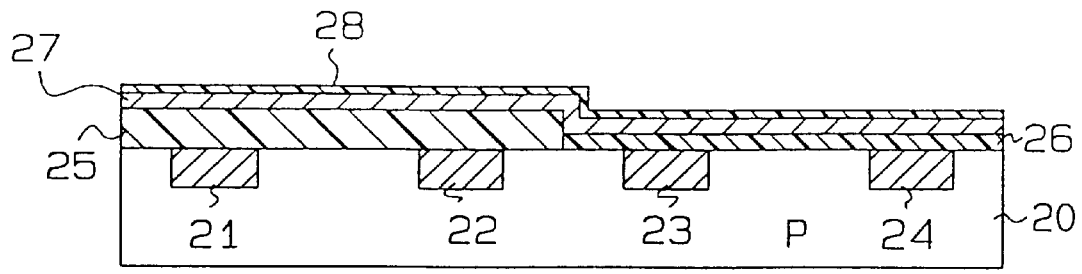
Figure 9:
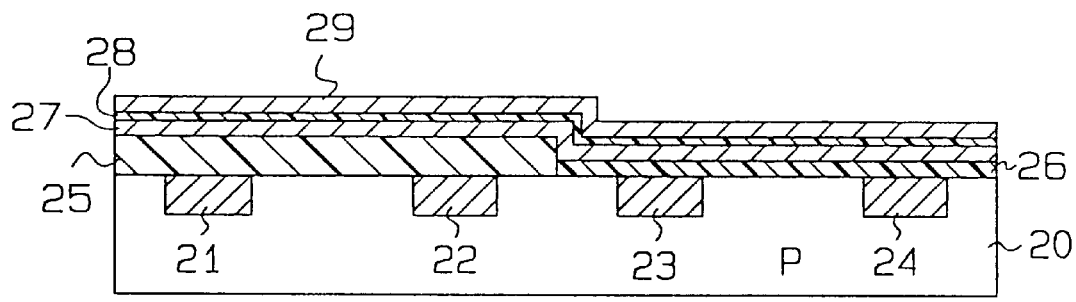
Figure 10:
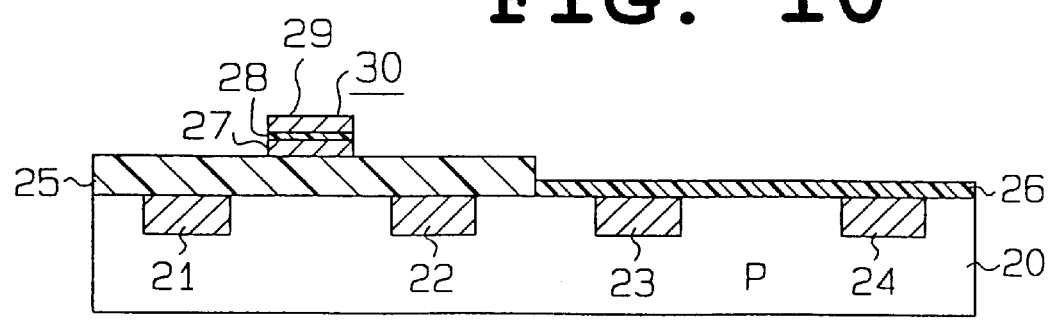

As is shown in FIG. 7, silane (SiH$_4$) is caused to flow in a state wherein the oven is at 550 to 650° C. and the supply of silane is stopped when polycrystalline silicon is deposited at a thickness of 1 μm on the silicon substrate 20, forming a first polycrystalline silicon layer 27. By selectively providing silane in this manner, a silicon oxide layer (natural oxidation layer) 28 is formed as an internal stress relieving layer having a thickness of several angstroms to several tens of angstroms on the first polycrystalline silicon layer 27, as is shown in FIG. 8. To continue, a second polycrystalline silicon layer 29 of 1 μm thickness is formed by means of causing silane to flow into the oven, as is shown in FIG. 9. Accordingly, after film formation in this manner, the deposit body of the first polycrystalline silicon layer 27, silicon oxide layer 28, and second polycrystalline silicon 29 is patterned by dry etching or the like through a photo-lithographic process, forming a movable member 30 of sensor, as is shown in FIG. 10.

Figure 11:
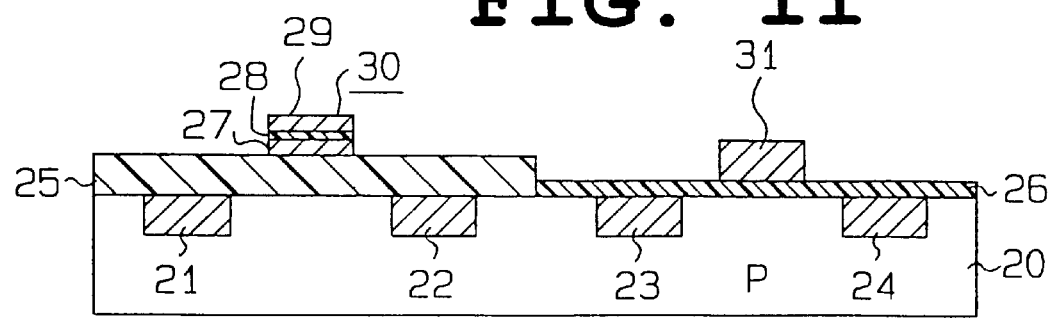

After formation of a movable member 30 in this manner, polycrystalline silicon is filmed and a gate electrode 31 of a transistor of peripheral circuitry is patterned with dry etching or the like through a photo-lithographic process, as is shown in FIG. 11.

Figure 12:
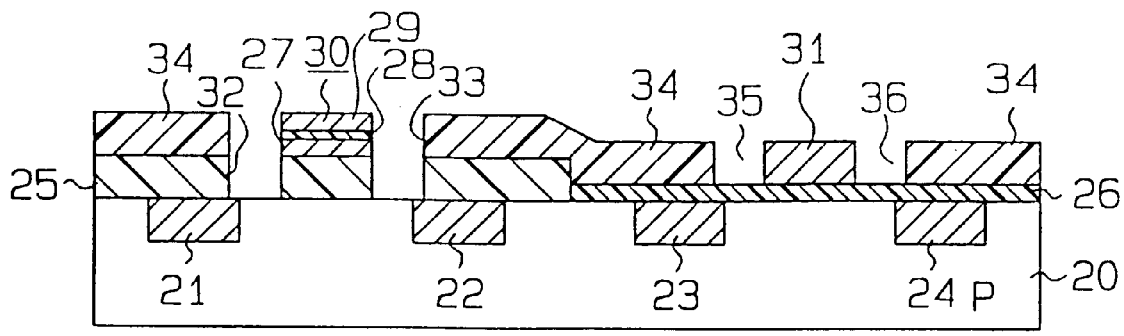

To continue, as is shown in FIG. 12, in order to form fixed electrodes of a sensor composed of an n-type diffusion region, holes 32 and 33 are formed on the silicon oxide film 25 through a photo-lithographic process self-aligning with respect to the movable member 30. Additionally, in order to form source/drain of transistors of the peripheral circuitry, holes 35 and 36 are formed by means of a resist 34 through a photo-lithographic process.

Figure 13:
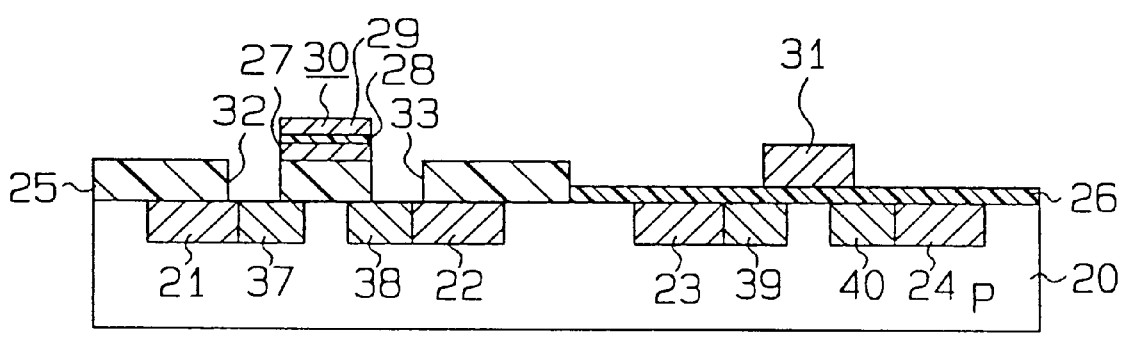

Furthermore, impurities are introduced with respect to movable member 30 and gate electrode 31 by means of ion-implantation or the like via holes 32 and 33 of the silicon oxide film 25 and resist 34 and via holes 35 and 36 of the resist 34, as is shown in FIG. 13, thereby forming fixed electrodes 37 and 38 composed of an n-type impurity region and source/drain regions 39 and 40 of transistors of the peripheral circuitry.

Figure 14:
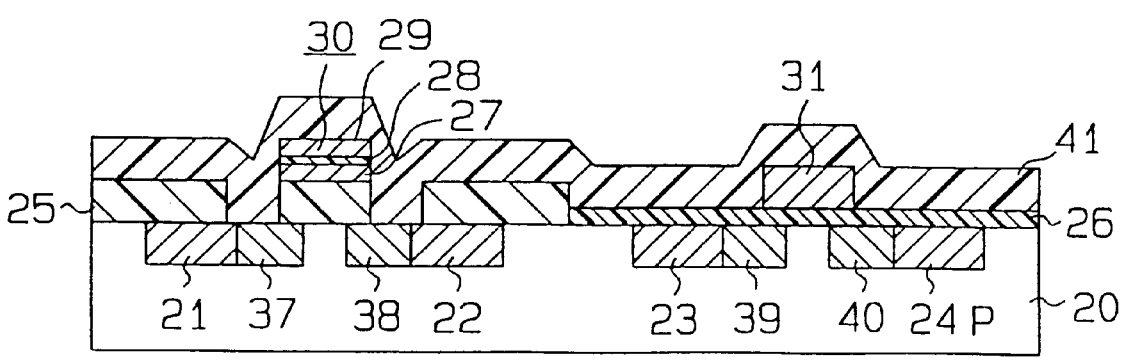
Figure 15:
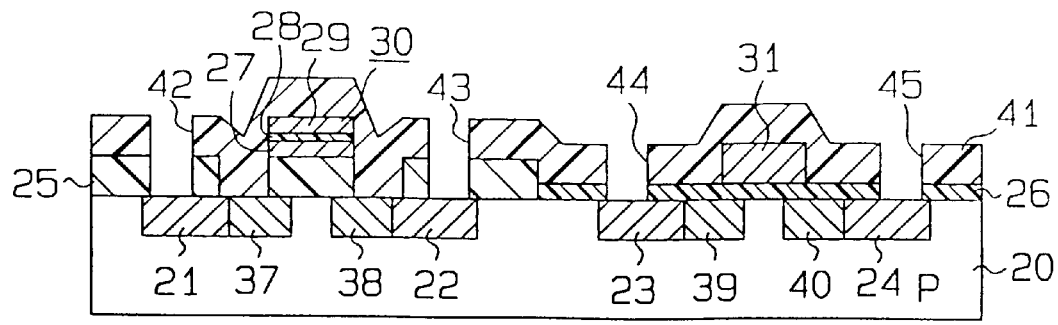

Next, as is shown in FIG. 14, an interlayer insulation film 41 is formed for the purpose of electrically isolating the movable member 30, gate electrode 31, and aluminum leads. Accordingly, as is shown in FIG. 15, contact holes 42, 43, 44, and 45, for the purpose of electrically connecting the diffusion regions for lead use 21, 22, 23, and 24 and the aluminum leads, are formed in the interlayer insulation film through a photo-lithographic process.

Figure 16:
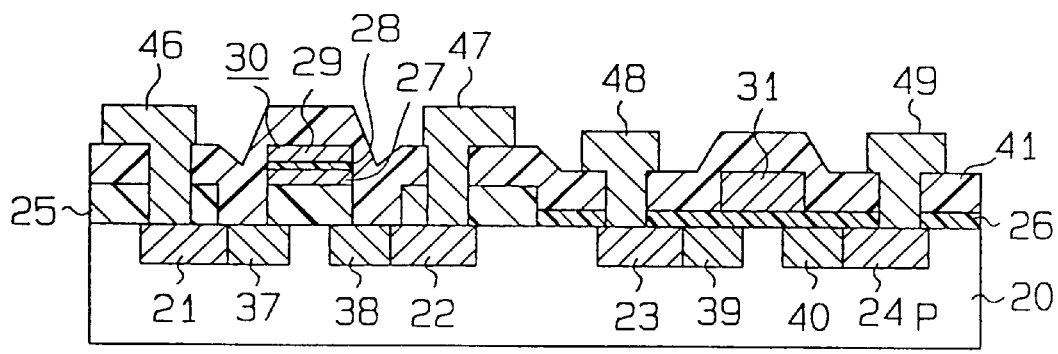
Figure 17:
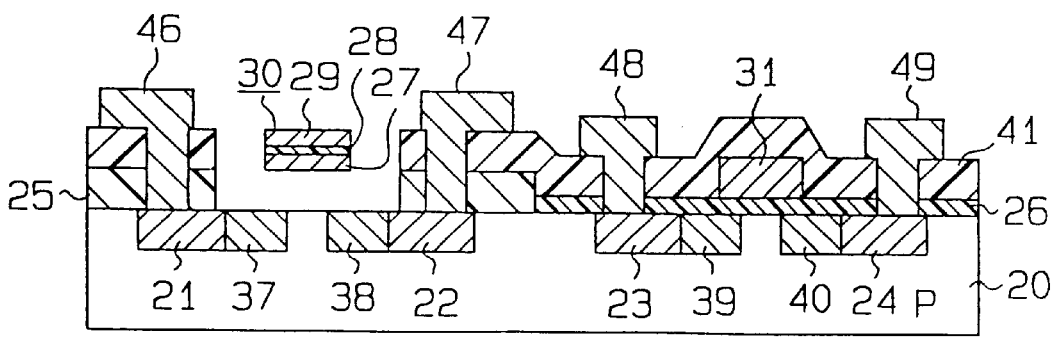

Furthermore, as is shown in FIG. 16, aluminum leads 46, 47, 48, 49, and the like are formed through a photo-lithographic process. Accordingly, as is shown in FIG. 17, an interlayer insulation film 41 portion and the silicon oxide film 25 below the movable member 30 are etched employing a hydrofluoric acid-based etchant.

At the time of this etching, as the stress relieving layer is several angstroms to several tens of angstroms in thickness, the etchant does not penetrate. That is to say, it is preferred to form the stress relieving layer to a thickness whereat the etchant does not penetrate.

Additionally, during this sacrificial layer etching, the integrated circuit section is protected by a nitride film not illustrated. A resist is applied on the nitride film during sacrificial layer etching, holes are created in the sensor portion only, and only the silicon oxide film 25, which is a sacrificial oxide film of the sensor portion, is etched away.

In this manner, the fabrication process for a MIS transistor type semiconductor acceleration sensor is completed.

In this method of sensor fabrication, deflection of the movable member 30 during film formation of the movable member 30 is suppressed by means of forming the silicon oxide layer 28. A suppression effect of deflection of the movable member 30 will be described hereinafter utilizing FIGS. 18 and 19.

Figure 18:
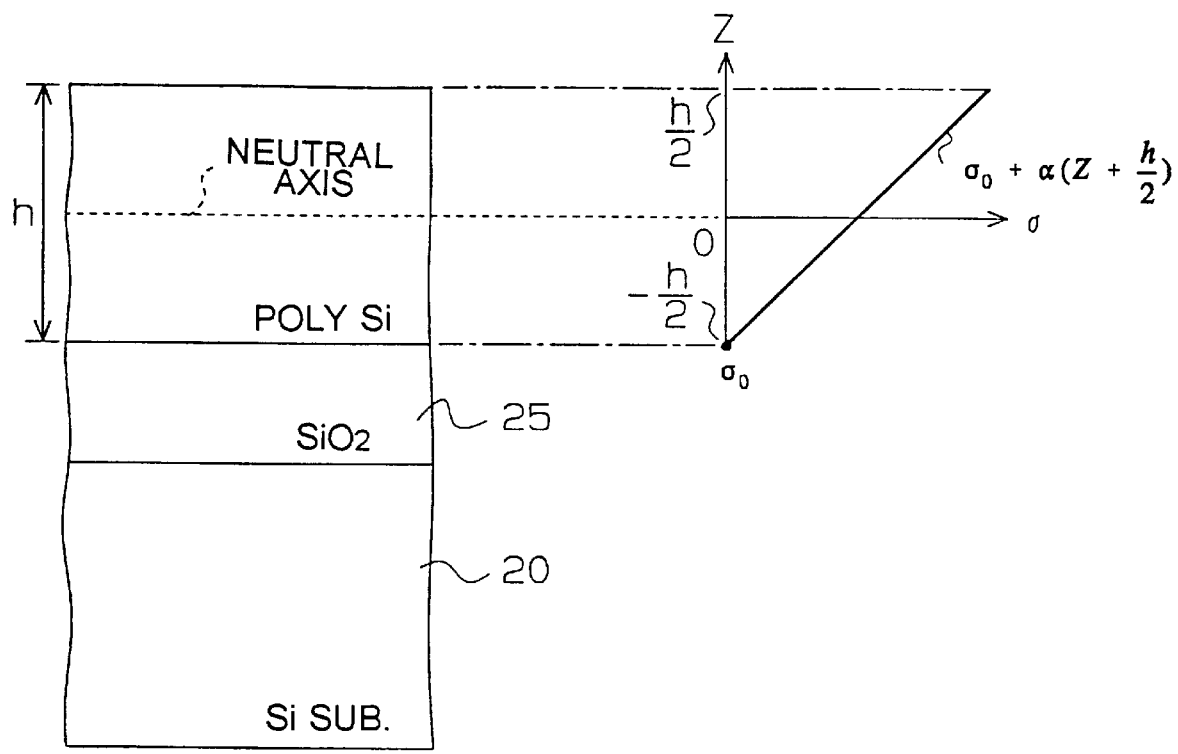
FIG. 18 is an explanatory diagram for the purpose of describing a stress state of a movable member.

As is shown in FIG. 18, in a case wherein a polycrystalline silicon thin film of thickness h is formed at one time on the silicon oxide film 25 (sacrificial layer), internal stress in the direction of film thickness is assumed by a linear function. That is to say, when it is assumed that internal stress is distributed with a gradient α, stress on the bottom of the film is taken to be $\sigma_o$, and the direction of film thickness is taken to be the Z axis, stress distribution on the direction of film thickness Z is expressed as $\sigma_z = \sigma_o + \alpha(Z + h/2)$. At this time, the bending moment $M_1$ generated on the neutral axis is determined in the following manner.

$$M_1 = \int_{-\frac{h}{2}}^{\frac{h}{2}} Z\left(\sigma_0 + \alpha\left(Z + \frac{h}{2}\right)\right) dZ \qquad (1)$$

$$= \frac{1}{12}\alpha h^3$$

Additionally, beam deformation due to this bending moment $M_1$ has a certain radius of curvature, and the radius of curvature $R_1$ at that time is determined in the following manner.

$$R_1 \frac{EI_z}{M_1} \quad (2)$$

$$\text{Herein, } I_z = \frac{1}{12}h^3$$

$$\therefore R_1 = \frac{E}{\alpha}$$

However, E is Young's modulus for the polycrystalline silicon thin film (movable member), and $I_z$ is the sectional quadratic moment.

Figure 19:
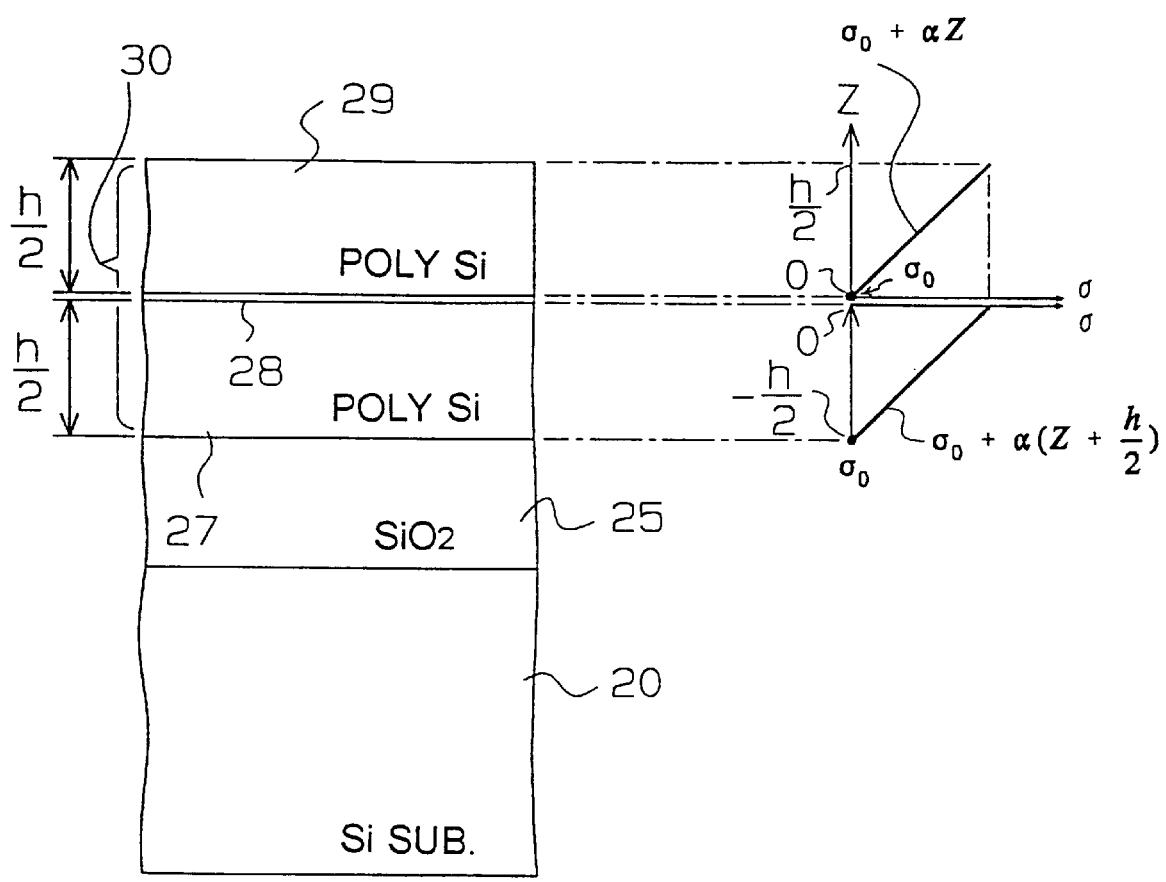
FIG. 19 is an explanatory diagram for the purpose of describing a stress state of a movable member according to the first embodiment.

In contrast to this, as is shown in FIG. 19, in a case wherein the polycrystalline silicon thin film is formed only to half the target film thickness (=h/2) and the silicon oxide layer 28 (internal stress relieving layer) is provided, and in continuation the remaining polycrystalline silicon thin film is formed, the bending moment $M_2$ generated on the neutral axis is determined in the following manner.

$$M_2 = \int_{-\frac{h}{2}}^{0} Z\left(\sigma_0 + \alpha\left(Z + \frac{h}{2}\right)\right) dZ + \int_{0}^{\frac{h}{2}} Z(\sigma_0 + \alpha Z) dZ \quad (3)$$

$$= \frac{1}{48}\alpha h^3$$

In this manner, $M_2 = \frac{1}{48} \times \alpha h^3 = \frac{1}{4} M_1$, and the bending moment becomes ¼ in comparison with the case wherein the polycrystalline silicon thin film is formed at one time as shown in FIG. 18.

Additionally, the radius of curvature $R_2$ due to the bending moment $M_2$ of this case is determined in the following manner.

$$R_2 \frac{EI_z}{M_2} \quad (4)$$

$$\text{Herein, } I_z = \frac{1}{12}h^3$$

$$\therefore R_2 = \frac{4E}{\alpha}$$

In this manner, $R_2 = 4E/\alpha = 4R_1$, and has four times the radius of curvature in comparison with the case wherein the polycrystalline silicon thin film is formed at one time as shown in FIG. 18.

In this manner, according to this embodiment, the silicon oxide film 25 (sacrificial layer) is formed on the silicon substrate 20 (semiconductor substrate), during film formation of the movable member 30 on the silicon oxide film 25 the silicon oxide layer 28 (internal stress relieving layer) is formed during the film formation thereof, the movable member 30 is formed, and thereafter the silicon oxide film 25 below the movable member 30 is etched. As a result of this, the silicon oxide layer 28 is formed during film formation of the movable member 30, and so internal stress generated from the interface with the silicon oxide film 25 (sacrificial layer) becomes gradually larger in the direction of film thickness but is relaxed and relieved by the silicon oxide layer 28, and so internal stress in the direction of film thickness is reduced. Accordingly, deflection of the movable member 30 is suppressed, and acceleration can be detected with high accuracy while uniformly maintaining the gap between the movable member 30 and the silicon substrate 20.

Additionally, according to this first embodiment, polycrystalline silicon is formed to a predetermined thickness by means of supplying silane to the oven in the fabrication process of the movable member 30, and thereafter the supply of silane is stopped and the silicon oxide layer 28 is formed as an internal stress relieving layer by means of atmosphere $O_2$, and silane is supplied to the oven again to form the polycrystalline silicon to a predetermined thickness. In this manner, the silicon oxide layer 28 can be formed as an internal stress relieving layer by the simple means of stopping the supply of silane.

Furthermore, as a means of reducing internal stress in the direction of film thickness of the film structure body, a method of performing long-term, high-temperature heat treatment of the film structure body (for example 24 hours at 1,150° C.) may be considered, but in this case damage is inflicted on transistors and the like forming peripheral circuitry. According to this embodiment, however, internal stress in the direction of film thickness of the film structure body can be reduced without performing long-term, high-temperature heat treatment, and so no damage is inflicted on the transistors of peripheral circuitry.

Figure 20:
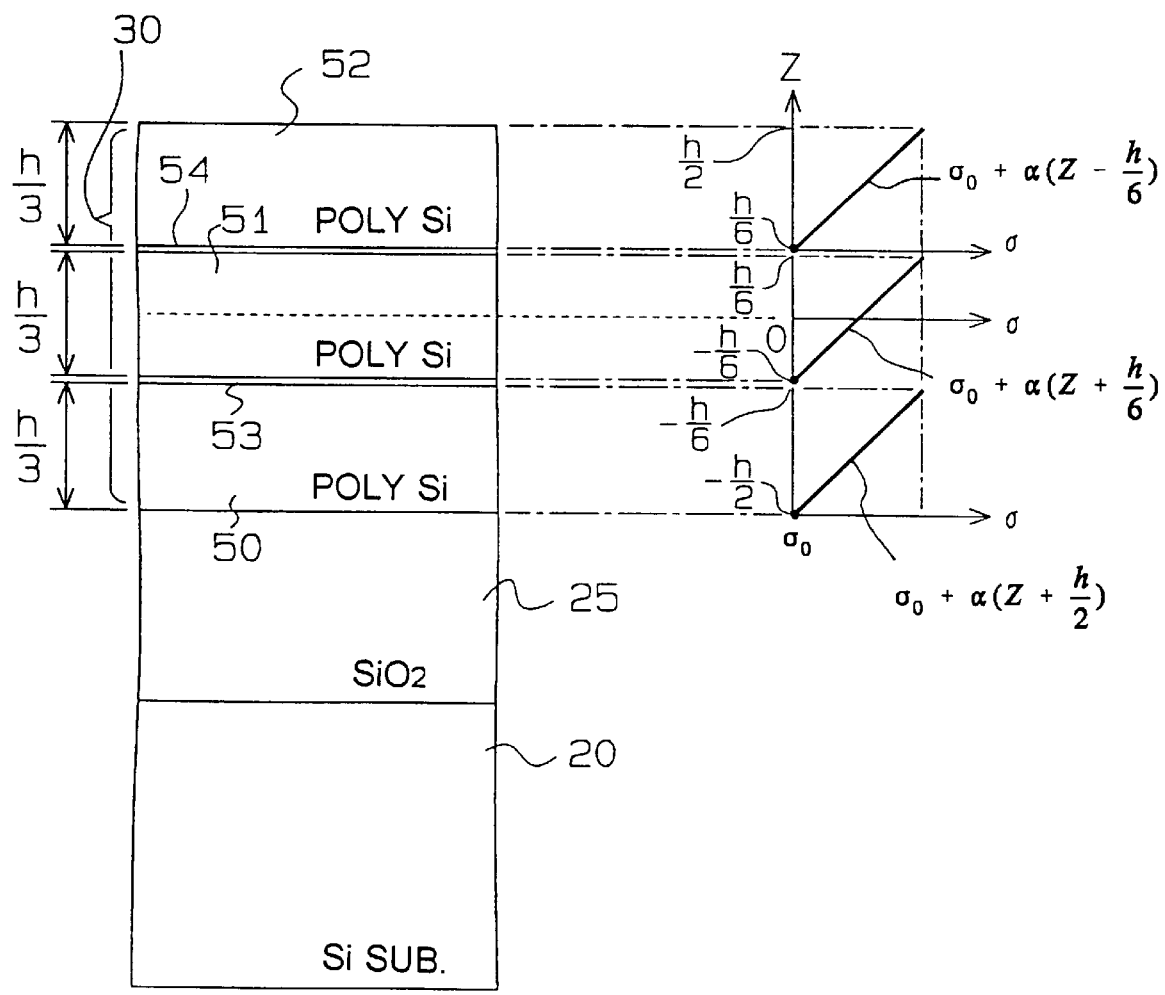
FIG. 20 is an explanatory diagram for the purpose of describing a stress state of a movable member according to a sample application the first embodiment.

Moreover, as a sample application according to this embodiment, it is also acceptable to form polycrystalline silicon layers 50, 51, and 52 of ⅓ of the target film thickness h to sandwich silicon oxide layers 53 and 54 by means of stopping the supply of silane two times during polycrystalline silicon film formation, as is shown in FIG. 20. In this case, interral stress in the direction of film thickness can be further reduced.

Still further, it is also acceptable to dispose three or more layers of silicon oxide layers as internal stress relieving layers.

Yet further, for the silicon oxide layer 28 as an internal stress relieving layer, it is also acceptable to introduce $O_2$ within the oven to form the silicon oxide layer 28, instead of stopping the supply of silane to within the oven and performing formation by means of atmosphere $O_2$.

Further, when the movable member formation is formed using a plurality of steps, it is not necessary to form the respective films, e.g., polycrystalline film 27 and 29 in FIG. 19 and 50 to 52 in FIG. 20, to an identical thickness. In other words, it is acceptable to form polycrystalline silicon layers in different thicknesses, respectively, with respect to the target film thickness h of the movable member. The film thickness ratio should be calculated and determined taking the state of the internal stress distribution into consideration.

Moreover, in order to form the silicon oxide layer 28 as an internal stress relieving layer, it is acceptable to interrupt the movable member film formation and expose the wafer in the air outside oven. In this arrangement, after forming of natural oxide film as silicon oxide layer 28 by means of exposing in the air, RCA washing, which is a standard cleaning method of the substrates, is preferable. By means of this, the film quality and film thickness of the formed natural oxide film can be stable, and also contaminations, such as organic matter or metal ion, adhered on tile wafer during handling of the wafer can be removed.

It may be acceptable to form silicon oxide layer 28 as the internal stress relieving layer with ordinary oxide film forming method.

Furthermore, in order to form the polycrystalline silicon film composing the movable member, it is acceptable to supply another silicon hydride, e.g., disilane ($Si_2H_6$) or the like, instead of silane.

In the combination of a sacrificial layer and an internal stress relieving layer, when the both layers are formed of the identical material, e.g., silicon oxide in the embodiment, it is easy to relax and reduce the internal stress generated in the movable member by means of the internal stress relieving layer as the first and second (upper) movable member formation films can be formed by almost same process condition. On the other hand, when the both layers, i.e., a sacrificial layer and an internal stress relieving layer, are formed of the different materials, the first and second (upper) movable member formation films may be formed in the different process conditions because of the different underlying film. In this case, however, the internal stress can be reduced by selecting the film formation conditions, thereby suppressing deflection of the movable member.

(Second Embodiment)

Next, a second embodiment will be described mainly on points of difference from the first embodiment.

Figure 21:
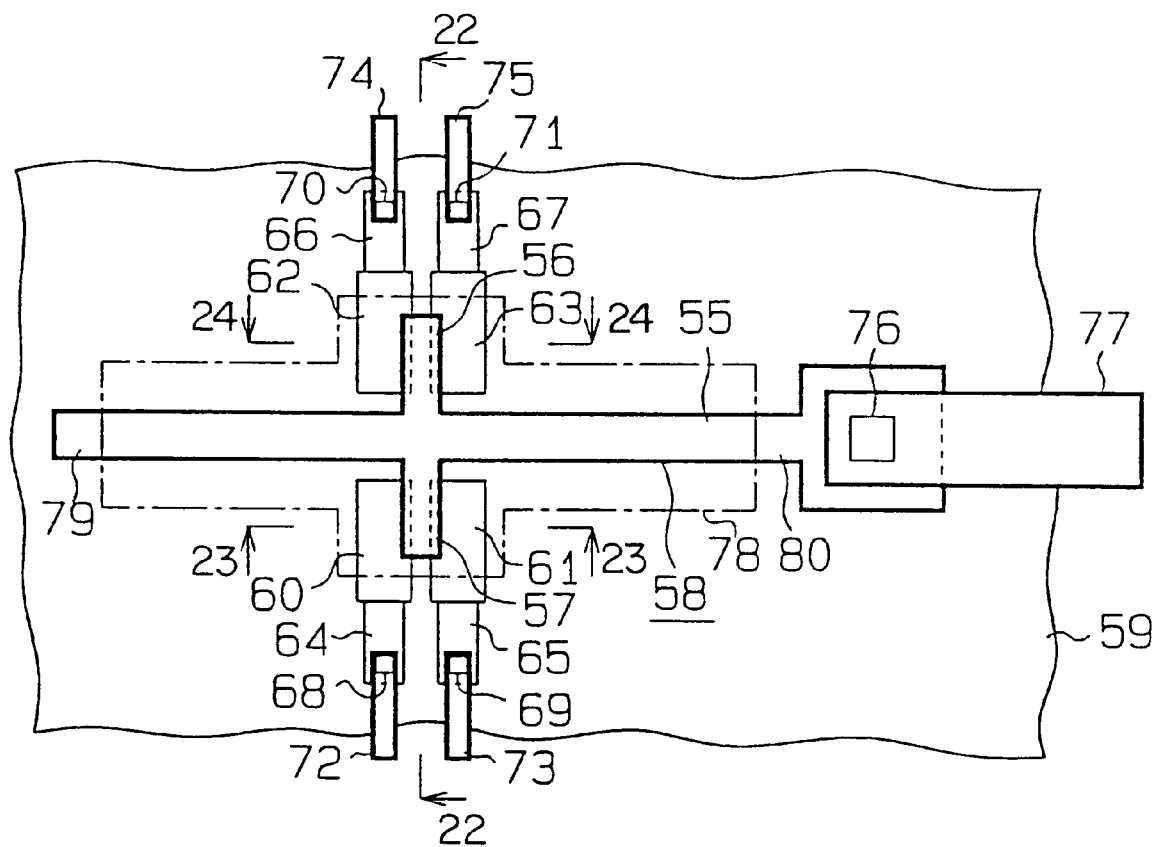
FIG. 21 is a plan view of a semiconductor acceleration sensor according to a second embodiment.
Figure 22:
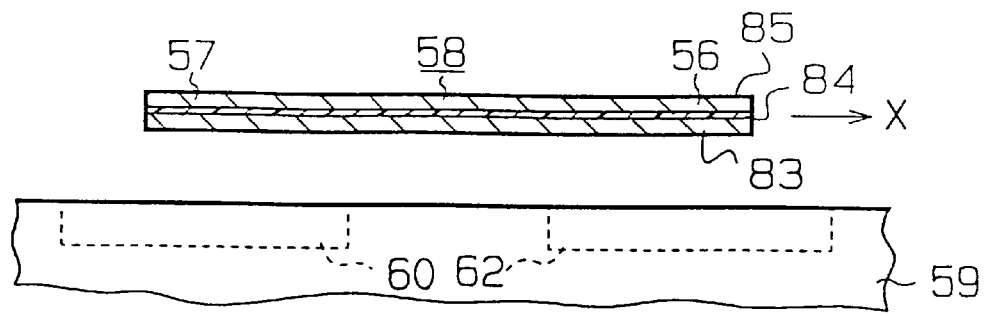
FIG. 22 is a sectional view taken along line 22—22 of FIG. 21.
Figure 23:
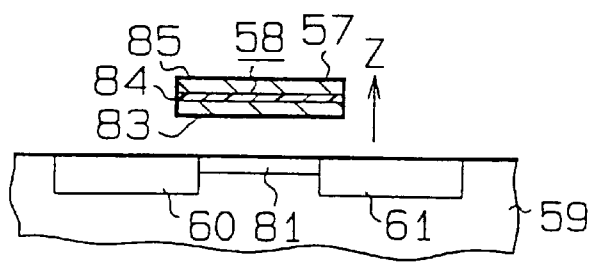
FIG. 23 is a sectional view taken along line 23—23 of FIG. 21.
Figure 24:
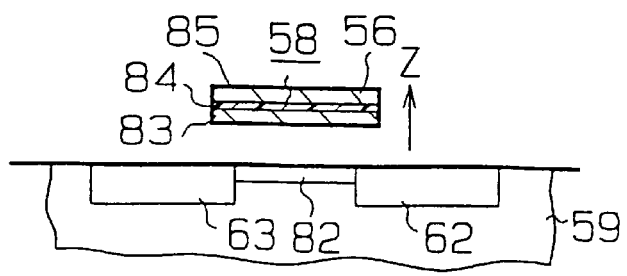
FIG. 24 is a sectional view taken along line 24—24 of FIG. 21.

FIG. 21 indicates a plan view of a semiconductor acceleration sensor according to this embodiment, FIG. 22 indicates a sectional view taken along line 23—23 of FIG. 21, FIG. 23 indicates a D—D sectional view of FIG. 21, and FIG. 24 indicates an E—E sectional view taken along line 24—24 of FIG. 21.

According to the first embodiment indicated in FIG. 1, a single cantilever has functions as an elastic body, a weight, and an electrode. However according to a second embodiment indicated in FIG. 21, a movable member 58 comprising a single doubly supported beam structure 55, which functions as an elastic body and as a weight, and two electrode sections 56 and 57, which functions as weights and as electrodes, are formed.

Fixed electrodes 60 and fixed electrodes 62 and 63, composed of an impurity diffusion region are formed on both sides of electrode sections 56 and 57, respectively, of a movable member 58 on a p-type silicon substrate 59 below the electrode sections 56 and 57. The respective fixed electrodes 60, 61, 62, and 63 are connected to diffusion regions for lead use 64, 65, 66, and 67, and are connected to aluminum leads 72, 73, 74, and 75 via contact holes 68, 69, 70, and 71. The movable member 58 is connected to an aluminum lead 77 via a contact hole 76.

An etching region 78 indicates a region etched as a sacrificial layer, which is a portion of an insulation film (not illustrated). By performing sacrificial layer etching, the movable member 58 (polycrystalline silicon thin film) is fixed to fixed ends 79 and 80 at two places, and the electrode sections 56 and 57 assume a movable structure.

FIG. 22 indicates that the fixed electrodes 60, 61, 62, and 63 are formed longer at both sides of the drawing than the electrode sections 56 and 57. In FIGS. 23 and 24, voltage is applied between the electrode sections 56 and 57 and the substrate 59, as well as between the fixed electrodes 60 and 61 and between the fixed electrodes 62 and 63. Inversion layers 81 and 82 are formed between the fixed electrodes 60 and 61 and between the fixed electrodes 62 and 63, and electrical currents flow respectively between the fixed electrodes 60 and 61 and between the fixed electrodes 62 and 63.

As is shown in FIGS. 22, 23, and 24, the movable member 58 is composed of a laminated body of a first polycrystalline silicon layer 83 and a silicon oxide layer 84 and a second polycrystalline silicon layer 85. The movable member 58 is formed by supplying silane to the oven, forming a polycrystalline silicon thin film only to half the target film thickness (=h/2) to form the first polycrystalline silicon layer 83 by means of a low-pressured chemical vapor deposition method, disposing the silicon oxide layer 84 (internal stress relieving layer) by means of atmosphere $O_2$ by means of stopping the supply of silane once, and forming the remaining polycrystalline silicon thin film to laminate the second polycrystalline silicon layer 85.

The operation of a semiconductor acceleration sensor capable of two-dimensional detection will be described next utilizing FIGS. 22, 23, and 24.

In a case wherein this acceleration sensor is subjected to acceleration and the electrode sections 56 and 57 (movable member) are (is) displaced in the X direction indicated in FIG. 22 (i.e., a direction parallel to the surface of the substrate 59), then by means of a change in the surface area (the gate width in transistor terms) of the inversion layer region between both fixed electrodes, current flowing to the fixed electrodes 60 and 61 decreases, and current flowing to the fixed electrodes 62 and 63 conversely increases. Meanwhile, in a case wherein this acceleration sensor is subjected to acceleration and the electrode sections 56 and 57 are displaced in the Z direction indicated in the drawing, the foregoing currents are simultaneously reduced because the carrier concentrations of the inversion layers 81 and 82 are reduced.

In this manner, this acceleration sensor can detect acceleration of two dimensions by detecting two amounts of current. That is to say, the structure is such that a pair of combinations of a movable electrode and two fixed electrodes are provided and an inversion layer region, i.e., gate width, increases on the one hand and decreases on the other hand due to displacement in a direction parallel to the substrate surface. Accordingly, it becomes possible to detect acceleration in directions respectively parallel to and perpendicular to the substrate surface based on an increase or decrease of the two amounts of current. That is to say, in a case wherein the two amounts of current change in phase, the beams are displaced in a direction perpendicular to the substrate surface, and in a case wherein the two amounts of current change in reverse phase, the beams are displaced in a direction parallel to the substrate surface, and acceleration can be detected.

In this manner, according to this embodiment, the electrode sections 56 and 57 on the movable member 58 assume a cantilever structure which takes the beam section 55 as a fixed end, but because the movable member 58 forms the first polycrystalline silicon layer 83, disposes the silicon oxide layer 84 (internal stress relieving layer), and thereafter forms the second polycrystalline silicon layer 85, internal stress in the direction of film thickness is reduced, and deflection of the electrode sections 56 and 57 can be suppressed.

(Third Embodiment)

Next, a third embodiment will be described mainly on points of difference from the first embodiment.

Figure 25:
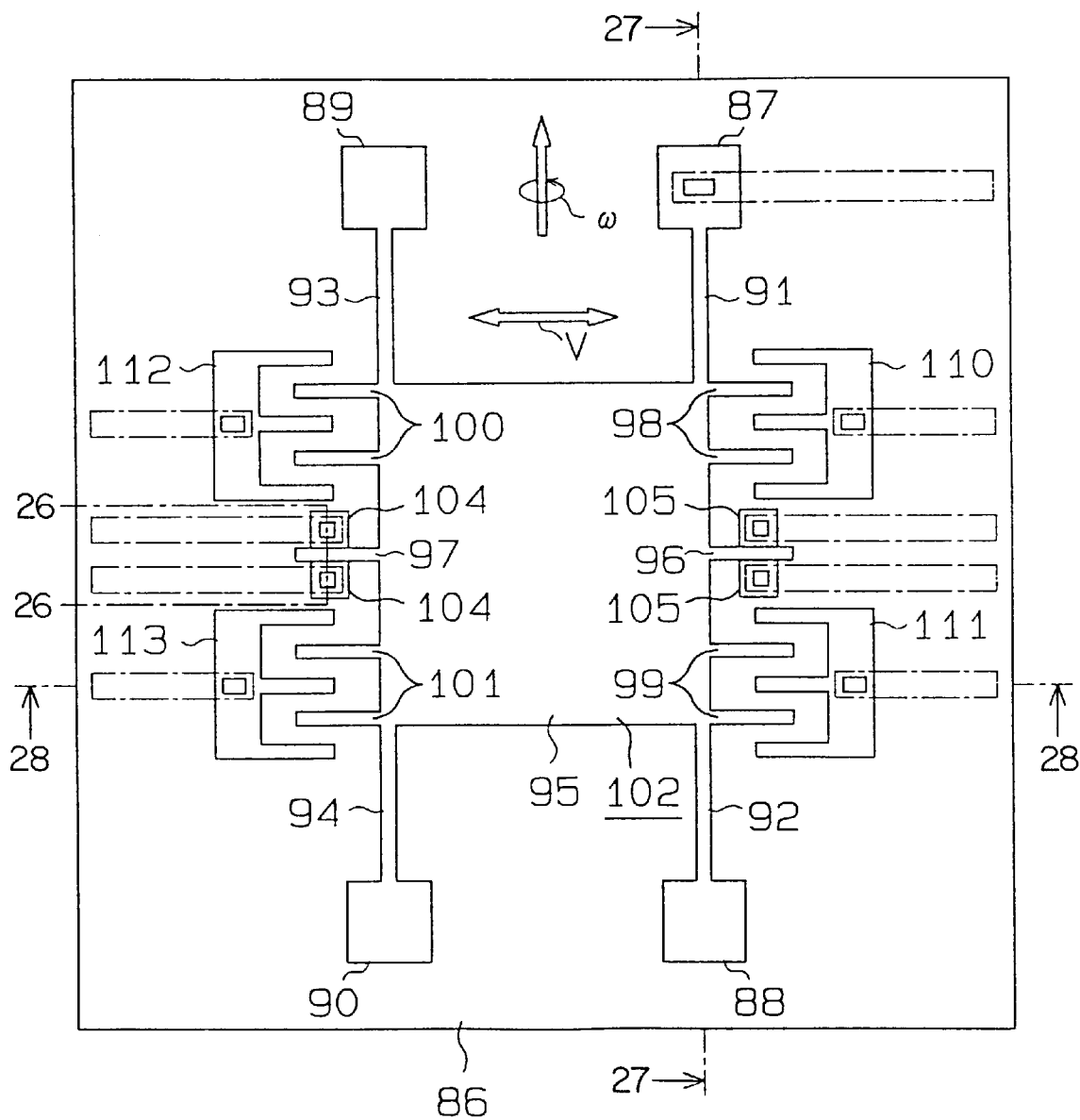
FIG. 25 is a plan view of a semiconductor yaw rate sensor according to a third embodiment.

This embodiment is a specific embodiment of a semiconductor yaw rate sensor. FIG. 25 indicates a plan view of a semiconductor yaw rate sensor, FIG. 26 indicates sectional view taken along line 26—26 of FIG. 25, FIG. 27 indicates a sectional view taken along line 28—28 of FIG. 25, and FIG. 28 indicates a sectional view taken along line 28—28 of FIG. 25.

Anchor sections 87, 88, 89, and 90 are formed in four places on a silicon substrate 86. A weight 95 is supported by means of beams 91, 92, 93, and 94 one respective end of which is supported by these anchor sections 87, 88, 89, and 90. Movable electrodes 96 and 97 protrude from this weight, and function as transistor gates. Additionally, vibration electrodes 98, 99, 100, and 101 extending in parallel protrude from this weight 95 with predetermined gaps interposed mutually therebetween.

The weight, movable electrodes 96 and 97, and vibration electrodes 98, 99, 100, and 101 in FIG. 25 are displaceable in a direction parallel to the substrate surface (direction V in the drawing) and in a direction perpendicular to the surface of the substrate 86. Additionally, the anchor sections 87 to 90, beams 91 to 94, weight 95, movable electrodes 96 and 97, and vibration electrodes 98 to 101 are formed integrally, and a movable member 102 is structured by means of these. This movable member 102 is composed of a polycrystalline silicon thin film.

Figure 27:
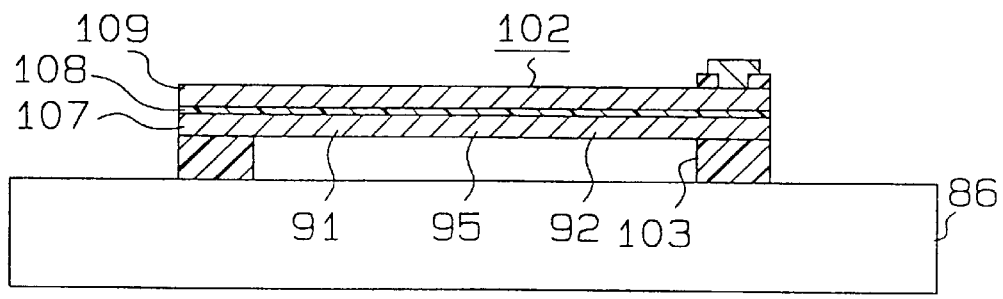
FIG. 27 is a sectional view taken along line 27—27 of FIG. 25.

As is shown in FIG. 27, an insulation film 103 is formed above the silicon substrate 86, and the beams 91, 92, 93, and 94 and weight 95 are suspended above this insulation film 103.

Figure 26:
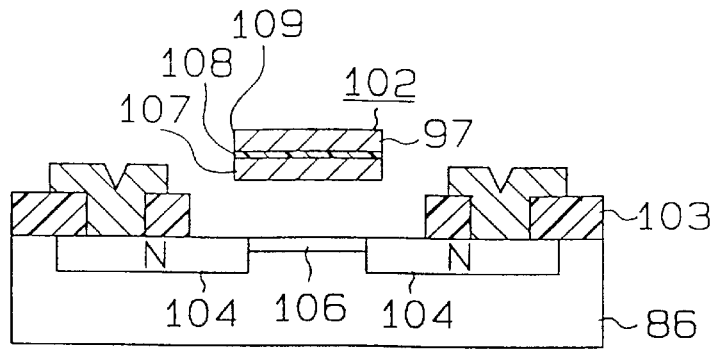
FIG. 26 is a sectional view taken along line 26—26 of FIG. 25.

As is shown in FIG. 26, fixed electrodes 104 (source/drain region) composed of an impurity diffusion region are formed on the silicon substrate 86 below the movable electrode 97 so as to sandwich the movable electrode. 97. Similarly, fixed electrodes 105 (source/drain region) composed of an impurity diffusion region are formed on the silicon substrate 86 below the movable electrode 96 so as to sandwich the movable electrode 96. Additionally, as is shown in FIG. 26, an inversion layer 106 is formed between the fixed electrodes 104 on the silicon substrate 86, and this inversion layer is produced by means of applying voltage between the silicon substrate 86 and the movable electrode 97. Similarly, an inversion layer is formed between the fixed electrodes 105 on the silicon substrate 86, and this inversion layer is produced by means of applying voltage between the silicon substrate 86 and the movable electrode 96.

Figure 28:
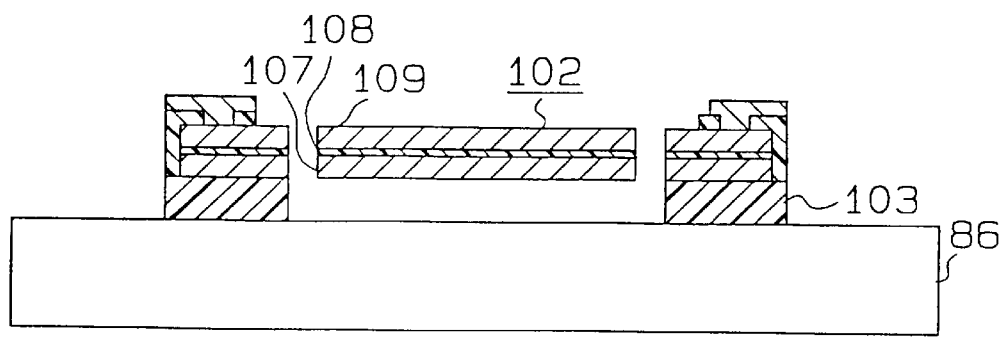
FIG. 28 is a sectional view taken along line 28—28 of FIG. 25.

As is shown in FIGS. 26, 27, and 28, the movable member 102 is composed of a laminated body of a first polycrystalline silicon layer 107 and a silicon oxide layer 108 and a second polycrystalline silicon layer 109. the movable member 102 is formed by supplying silane to the oven and forming a polycrystalline silicon thin film only to half the target film thickness (=h/2) to form the first polycrystalline silicon layer 107 by means of a low-pressured chemical vapor deposition method, disposing the silicon oxide layer 108 (internal stress relieving layer) by means of atmosphere $O_2$ by stopping the supply of silane once, and in continuation forming the remaining polycrystalline silicon thin film to laminate the second polycrystalline silicon layer 109.

Fixed electrodes for vibrating use 110, 111, 112, and 113 are disposed on the top surface of the silicon substrate 86 in an opposing relation and separated by a predetermined gap with respect to the respective vibration electrodes 98, 99, 100, and 101. Accordingly, when voltage is applied between the electrodes 98 and 110, the electrodes 99 and 111, the electrodes 100 and 112, and the electrodes 101 and 113, and mutually attracting force is applied, the weight 95 and movable electrodes 96 and 97 are vibrated in a direction parallel to the substrate 86 (the V direction in FIG. 25). When a yaw force ω is exerted in this vibrating state, Coriolis force is exerted, and the weight 95 and movable electrodes 96 and 97 are displaced in a direction perpendicular to the substrate. This change is detected as a change in drain currents between the fixed electrodes 104 and between the fixed electrodes 105 provided in correspondence to the movable electrodes 96 and 97.

In this manner, according to this embodiment, in the formation of the movable member 102, because the second polycrystalline silicon layer 109 is formed after forming the first polycrystalline silicon layer 107 and disposing the silicon oxide layer 108 (internal stress relieving layer), the movable electrodes 96 and 97 and the vibration electrodes 98, 99, 100, and 101 assume a cantilever structure taking the weight 95 as a fixed end, and internal stress in the direction of film thickness is reduced and deflection of the movable electrodes 96 and 97 and the vibration electrodes 98, 99, 100, and 101 can be suppressed. As a result of this, the vibration electrodes 98, 99, 100, and 101 can be disposed in an opposing relation with good precision with respect to the fixed electrodes for vibrating use 110, 111, 112, and 113. Additionally, because deflection of the weight 95 is suppressed as well, the movable electrodes 96 and 97 and vibration electrodes 98, 99, 100, and 101 protruding from this weight 95 can also be disposed with good precision.

Figure 29:
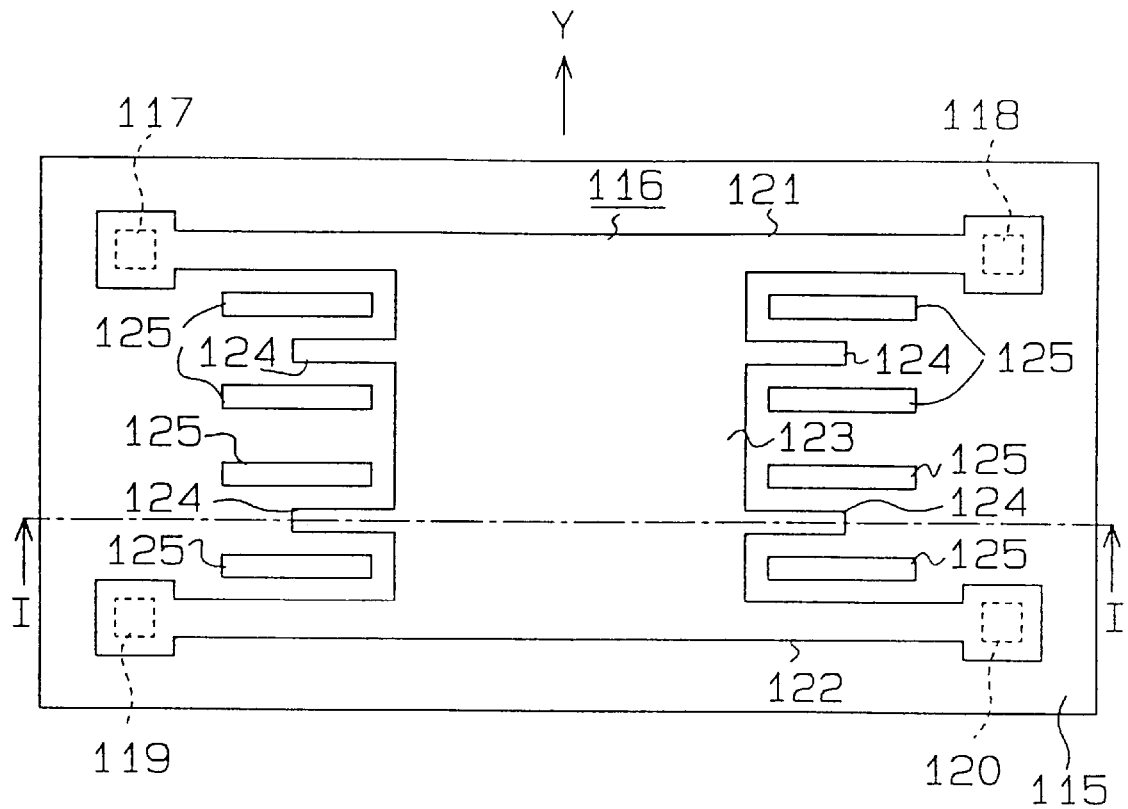
FIG. 29 is a pla.i view of a semiconductor acceleration sensor for the purpose of describing the conventional art.
Figure 30:
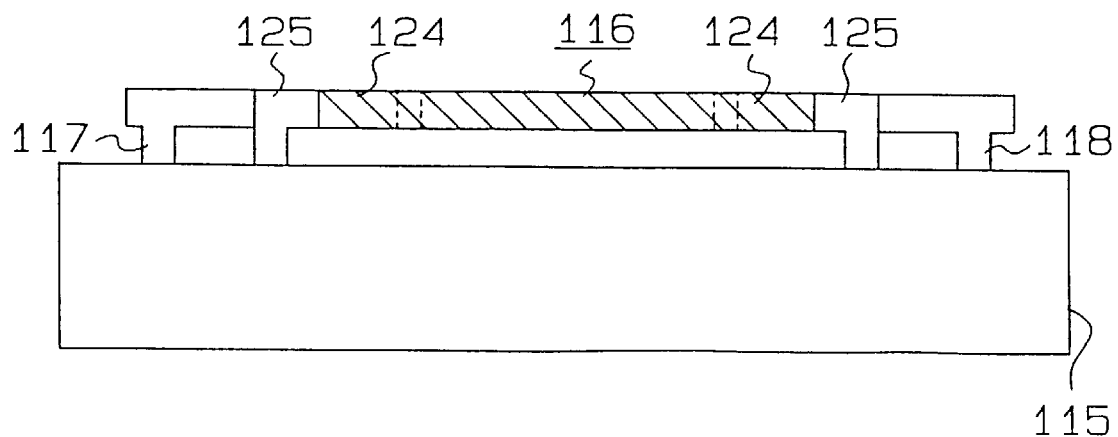
FIG. 30 is a sectional view taken along line I—I of FIG. 29.
Figure 31:
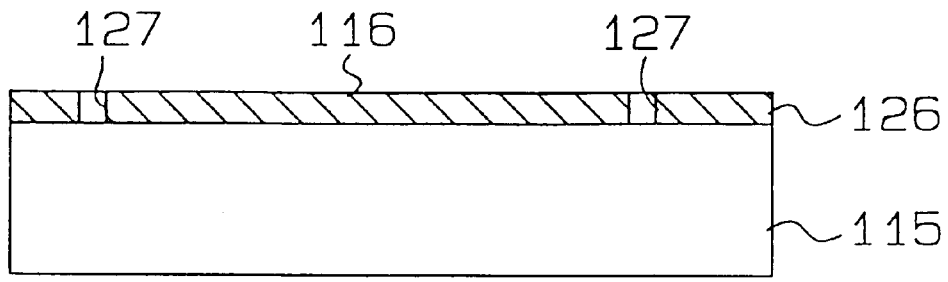
FIGS. 31 to 33 are sectional views for the purpose of describing a method for fabricating a conventional semiconductor acceleration sensor.
Figure 32:
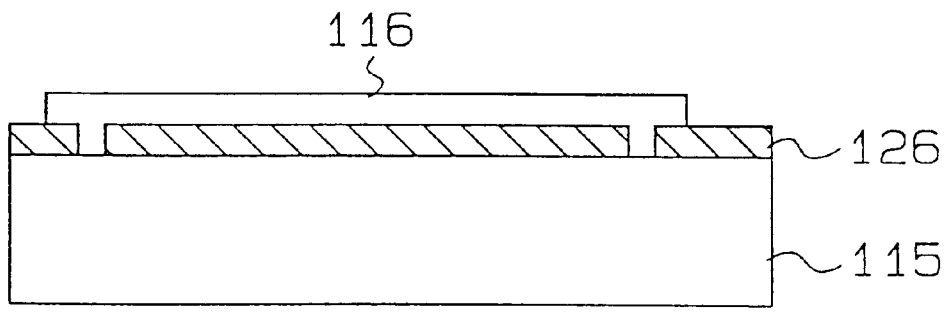
Figure 33:
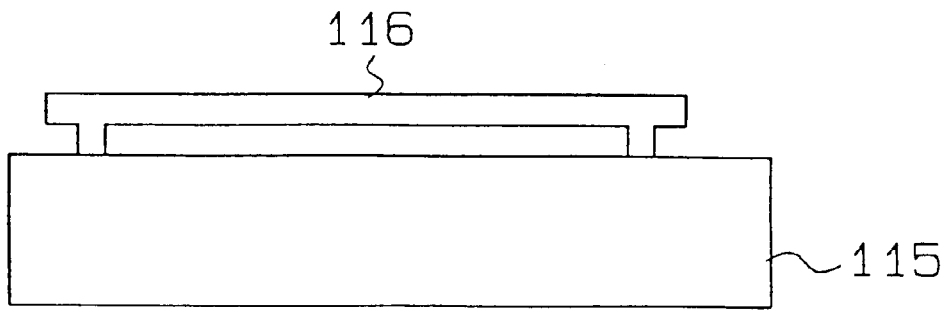
Figure 34:
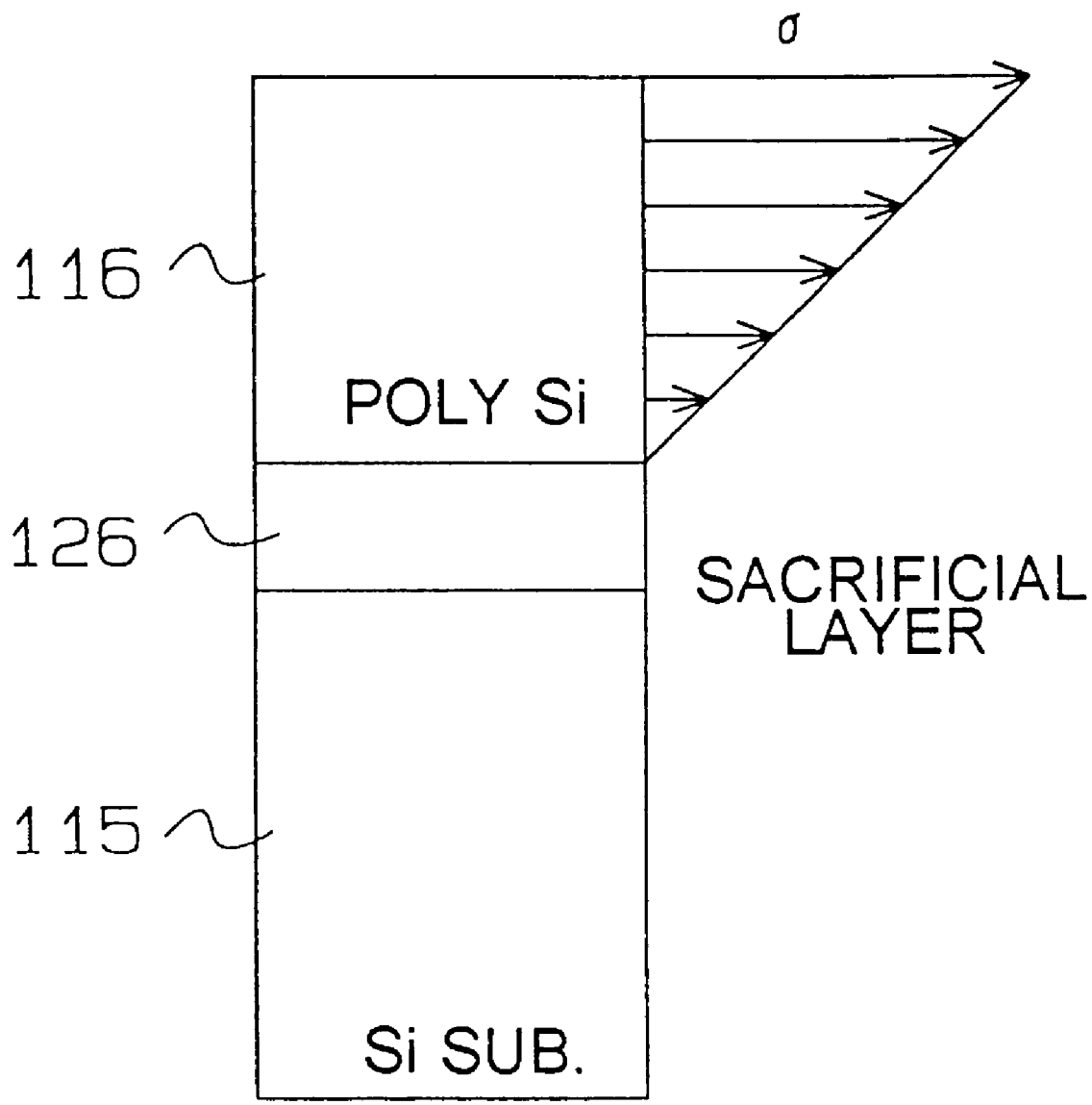
FIG. 34 is an explanatory diagram for the purpose of describing a stress state of a movable member.

Furthermore, the present invention is not exclusively limited to the above-described embodiments. For example, the foregoing first and second embodiments are specific embodiments of a MIS transistor type semiconductor acceleration sensor, but a differential-capacitance type semiconductor acceleration sensor indicated in FIG. 29 is also acceptable. In this case, deflection of a movable member 116 composed of a polycrystalline silicon thin film is suppressed. Accordingly, deflection of a movable electrode section 124 is also suppressed, and the movable electrode section 124 and a fixed electrode 125 can be disposed opposingly with good precision. Additionally, deflection of a weight section 123 can also be suppressed, the movable electrode section 124 protruding from the weight section 123 can also be disposed at a predetermined position, and because of this as well the movable electrode section 124 and fixed electrode 125 can be disposed opposingly with good precision.

In addition, specific embodiment in a semiconductor vibration sensor to detect vibration instead of a semiconductor acceleration sensor or semiconductor yaw rate sensor is also acceptable.

Figure 2:
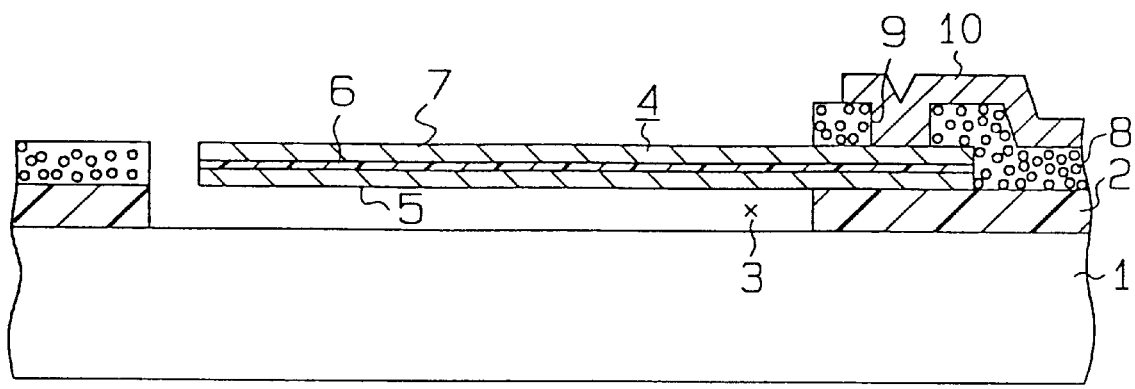
FIG. 2 is a sectional view taken along line 2—2 of FIG. 1.

Moreover, according to the respective foregoing embodiments, a silicon oxide layer as an internal stress relieving layer is formed during film formation of the movable member and caused to remain as a final product, but it is also acceptable to perform diffusion into the polycrystalline silicon by means of annealing (for example 950° C.) the silicon oxide layer as an internal stress relieving layer after film formation of the movable member. By means of this annealing, the silicon oxide layer 6 as the insulation layer indicated in FIGS. 2 and 3 is diffused and disappears, and so electrical connection with the polycrystalline silicon layers 5 and 7 can be made.

Furthermore, according to the foregoing respective embodiments, an internal stress relieving layer is formed on the first polycrystalline silicon layer 27 as a natural oxidation film. However, this is not exclusive, and as another formation method of the internal stress relieving layer, it is also acceptable to extract the wafer from the oven once after forming the first polycrystalline silicon layer 27 and perform oxide film formation by means of RCA washing or the like. By means of this, an oxide film of constantly uniform film thickness can be formed.

Additionally, repeated experimentation by the inventors confirmed that even when forming the movable member using seperate formation steps, that is to say, even when a thin oxide film of natural oxidation film or the like is not interposed, an internal stress initialization effect can be expected.

Furthermore, the internal stress initialization (relaxation) effect can be expected by the following methods.

Referring to FIG. 19, for example, after the polycrystalline silicon thin film 27 is formed only to half the target film thickness, the surface thereof is subjected to a surface refining treatment to form a refined region 28 at the surface of the first polycrystalline silicon film 27. To continue, second polycrystalline silicon film 29 is formed on the refined region 28 of the first polycrystalline silicon film 27.

In a method of sensor fabrication of this manner, deflection of the movable member 30 is suppressed by means of forming the refined region 28. Incidentally, the refined region 28 can be formed by exposing the polycrystalline silicon surface to plasma gas or annealing the polycrystalline silicon surface with laser beams.

According to this embodiment, the silicon oxide film 25 (sacrificial layer) is formed on the silicon substrate 20 (semiconductor substrate), during film formation of the movable member 30 on the silicon oxide film 25 the refined region 28 (internal stress relieving layer) is formed by means of the surface refining treatment, the movable member 30 is formed, and thereafter the silicon oxide film 25 below the movable member 30 is etched. As a result of this, the refined region 28 is formed during film formation of the movable member 30, and so internal stress generated from the interface with the silicon oxide film 25 (sacrificial layer) becomes gradually larger in the direction of film thickness but is relaxed and relieved by the refined region 28, and so internal stress in the direction of film thickness is reduced. Accordingly, deflection of the movable member 30 is suppressed, and acceleration can be detected with high accuracy while uniformly maintaining the gap between the movable member 30 and the silicon substrate 20.

Further, it is acceptable to dispose two or more refined regions as internal stress relieving layers.

In addition, amorphous silicon, microcrystalline silicon, aluminum, tungsten, or the like is also acceptable instead of polycrystalline silicon for the material of the movable member. Moreover, as the film formation method of the movable member, it is also acceptable to employ another chemical vapor deposition process which is a plasma chemical vapor deposition process or the like, or a vapor deposition process, or a spattering process, instead of the low-pressured chemical vapor deposition process.

Still further, it is acceptable if the sacrificial layer is a nitride film being a silicon nitride film or the like, or PSG, or BSG, or BPSG, instead of a silicon oxide film. Additionally, it is acceptable if the material of the internal stress relieving layer is a nitride film being a silicon nitride film or the like, or PSG, or BSG, or BPSG, instead of a silicon oxide film.

While the present invention has been shown and described with reference to the foregoing preferred embodiments, it will be apparent to those skilled in the art that changes in form and detail may be made therein without scope of the invention as defined in the appended claims.

What is claimed is:

1. A semiconductor sensor, comprising:
a semiconductor substrate; and
a beam structure film suspended by means of said semiconductor substrate with a predetermined gap interposed therebetween and caused to be movable with respect to said semiconductor substrate,
wherein said beam structure film has a structure wherein a plurality of films are laminated in a direction of film thickness, with a stress relieving layer interposed between respective films.

2. A semiconductor sensor according to claim 1, wherein said stress relieving layer is several angstroms to several tens of angstroms.

3. A semiconductor sensor according to claim 1, wherein said stress relieving layer is a natural oxidation film.

4. A semiconductor sensor according to claim 1, whrein said stress relieving layer is a film selected from the group consisting of an oxide film, a nitride film, a PSG (phosphosilicate glass) film, a BSG (borosilicate glass) film, and a BPSG (borophosphosilicate glass) film.

5. A semiconductor sensor according to claim 1, wherein said stress relieving layer is interposed so that said respective films collectively making up said beam structure film have a same thickness.

6. A semiconductor sensor according to claim 1, wherein said respective films collectively making up said beam structure film have a same thickness.

7. A semiconductor sensor according to claim 1, wherein said respective films collectively making up said beam structure film are composed of a polycrystalline silicon film.

8. A semiconductor sensor according to claim 1, wherein said stress relieving layer is a surface modification region of a surface region of said respective films forming said beam structure film.

9. A semiconductor sensor according to claim 8, wherein said surface modification region is a laser-annealed region.

10. A semiconductor sensor, comprising:
a semiconductor substrate; and
a film that is suspended by said semiconductor substrate with a predetermined gap interposed therebetween, and that is movable with respect to said semiconductor substrate;
wherein said film includes a plurality of film layers laminated in a direction of film thickness, with a stress relieving layer interposed between respective film layers.

* * * * *